(12) United States Patent
Li et al.

(10) Patent No.: US 10,504,942 B2
(45) Date of Patent: Dec. 10, 2019

(54) METHOD OF MANUFACTURING ARRAY SUBSTRATE AND METHOD OF MANUFACTURING DISPLAY DEVICE

(71) Applicant: BOE TECHNOLOGY GROUP CO., LTD., Beijing (CN)

(72) Inventors: Haixu Li, Beijing (CN); Zhanfeng Cao, Beijing (CN); Qi Yao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/928,761

(22) Filed: Mar. 22, 2018

(65) Prior Publication Data

US 2019/0027512 A1 Jan. 24, 2019

(30) Foreign Application Priority Data

Jul. 19, 2017 (CN) .......................... 2017 1 0590258

(51) Int. Cl.
*H01L 27/12* (2006.01)
*H01L 21/3213* (2006.01)
(Continued)

(52) U.S. Cl.
CPC .... *H01L 27/1262* (2013.01); *H01L 21/32131* (2013.01); *H01L 21/32139* (2013.01);
(Continued)

(58) Field of Classification Search
CPC .................. H01L 27/1262; H01L 21/32139
See application file for complete search history.

(56) References Cited

U.S. PATENT DOCUMENTS 9,218,082 B2  12/2015  Oh et al.
9,274,368 B2   3/2016  Hui
(Continued)

FOREIGN PATENT DOCUMENTS

CN  102411239 A  4/2012
CN  103325732 A  9/2013

OTHER PUBLICATIONS

Office Action dated Apr. 15, 2019 issued in corresponding Chinese Application No. 201710590258.5.

*Primary Examiner* — Jay C Chang
*Assistant Examiner* — Mikka Liu
(74) *Attorney, Agent, or Firm* — Nath, Goldberg & Meyer; Joshua B. Goldberg

(57) ABSTRACT

The present disclosure provides a method of manufacturing an array substrate and a method of manufacturing a display device. The method of manufacturing an array substrate includes steps of: forming a planarization layer above a base substrate; forming an electrode layer above the planarization layer; forming a metal functional layer above the electrode layer; patterning the metal functional layer by using a multi-greyscale mask layer as a mask; forming an insulating protection layer on a portion of the electrode layer not being covered by the patterned metal functional layer; performing an ashing process on the multi-greyscale mask layer; patterning the electrode layer by using the metal functional layer as a mask; further patterning the metal functional layer by using the multi-greyscale mask layer subjected to the ashing process as a mask.

18 Claims, 7 Drawing Sheets

(51) Int. Cl.
*H01L 29/66* (2006.01)
*H01L 21/467* (2006.01)
(52) U.S. Cl.
CPC ........ *H01L 21/467* (2013.01); *H01L 27/1248* (2013.01); *H01L 27/1259* (2013.01); *H01L 27/1288* (2013.01); *H01L 29/66765* (2013.01)

(56) References Cited

U.S. PATENT DOCUMENTS

| | | | | |
|---|---|---|---|---|
| 2008/0110858 | A1* | 5/2008 | Itoh | H01L 27/1288 216/41 |
| 2012/0068944 | A1* | 3/2012 | Oh | G02F 1/13338 345/173 |

* cited by examiner

METHOD OF MANUFACTURING ARRAY SUBSTRATE AND METHOD OF MANUFACTURING DISPLAY DEVICE

CROSS-REFERENCE TO RELATED APPLICATION

The present application claims priority to Chinese Patent Application No. 201710590258.5 filed on Jul. 19, 2017, entitled "METHOD OF MANUFACTURING ARRAY SUBSTRATE AND METHOD OF MANUFACTURING DISPLAY DEVICE", the disclosure of which is hereby incorporated by reference in its entirety.

TECHNICAL FIELD

The present disclosure relates to the field of display technology, and in particularly, to a method of manufacturing an array substrate and a method of manufacturing a display device.

BACKGROUND

Thin film transistors (TFTs) are pixel-driven components of an active matrix liquid crystal display (AMLCD) and an active matrix organic light emitting diode (AMOLED) display, and play an important role in realizing large-size, high-definition and high-frame-frequency displays. At present, materials of an active layer of a TFT mainly include hydrogenated amorphous silicon, low temperature polycrystalline silicon, organic semiconductors, and oxide semiconductors. Oxide semiconductors have high electron mobility and good uniformity, thus are suitable for driving AMLCDs and AMOLEDs. In order to realize high-resolution display, the TFT needs to be miniaturized, and a realization of a back-channel etched (BCE) structure is the key to miniaturize the TFT.

SUMMARY

The present disclosure provides a method of manufacturing an array substrate, including steps of: forming a planarization layer above a base substrate; forming an electrode layer above the planarization layer, forming a metal functional layer above the electrode layer; patterning the metal functional layer by using a multi-greyscale mask layer as a mask; forming an insulating protection layer on a portion of the electrode layer not being covered by the patterned metal functional layer; performing an ashing process on the multi-greyscale mask layer; patterning the electrode layer by using the metal functional layer as a mask; and further patterning the metal functional layer by using the multi-greyscale mask layer subjected to the ashing process as a mask.

In some embodiments, the step of forming the insulating protection layer further includes: forming a metal layer on the electrode layer; and performing an oxidation process on the metal layer to obtain a transparent and insulating metal oxide layer serving as the insulating protection layer.

In some embodiments, the step of forming the metal layer on the electrode layer further includes: depositing the metal layer on the electrode layer by using a magnetron sputtering method.

In some embodiments, the metal layer has a thickness ranging from 100 Å to 200 Å.

In some embodiments, the metal layer includes aluminum, and the insulating protection layer includes aluminum oxide ($Al_2O_3$).

In some embodiments, the oxidation process is performed on the metal layer by using an ion implantation apparatus.

In some embodiments, the method further includes: before patterning the electrode layer by using the metal functional layer as the mask, removing the insulating protection layer.

In some embodiments, the step of patterning the metal functional layer by using the multi-greyscale mask layer as the mask further includes: applying a photoresist layer on the metal functional layer; exposing the photoresist layer by using a multi-greyscale mask plate to form the multi-greyscale mask layer on the metal functional layer, and removing a portion of the metal functional layer not being covered by the multi-greyscale mask layer.

In some embodiments, the metal functional layer includes Mo, and the electrode layer includes ITO.

In some embodiments, the method further includes: before forming the metal functional layer above the electrode layer, forming a metal layer on the electrode layer; and forming the metal functional layer on the metal layer.

In some embodiments, the step of forming the insulating protection layer further includes: performing an oxidation process on a portion of the metal layer not being covered by the patterned metal functional layer to obtain a transparent and insulating metal oxide layer serving as the insulating protection layer.

In some embodiments, the method further includes: before forming the planarization layer on the base substrate, providing the base substrate; and forming a gate, a gate insulating layer, an active layer, a source and a drain, and a passivation layer successively on the base substrate.

The present disclosure further provides a method of manufacturing a display device, including the method of manufacturing the array substrate mentioned above.

DETAILED DESCRIPTION

To enable those skilled in the art to better understand technical solutions of the present disclosure, the method of manufacturing an array substrate and the method of manufacturing a display device in accordance with the present disclosure will be described in detail below in conjunction with accompanying drawings.

In the BCE structure, in order to reduce capacitance crosstalk and reduce power consumption, a planarization layer is generally provided between a source and drain and an electrode layer (a pixel electrode or a common electrode). In addition, in a circuit design, in order to achieve a certain storage capacitance, a metal functional layer is provided on the electrode layer. In the process of manufacturing the array substrate with such a structure, during etching the electrode layer and the metal functional layer, an HTM (Half Tone Mask) process is generally used to simultaneously etch the electrode layer and the metal functional layer to reduce the cost. However, the HTM process involves an ashing process, that is, after the metal functional layer is patterned into a desired pattern of the electrode layer by using a multi-greyscale mask layer, it is required to performing an ashing process on the multi-greyscale mask layer; then, the metal functional layer is patterned into its desired pattern by using the multi-greyscale mask layer subjected to the ashing process.

However, since the ashing gas is oxygen, and when the ashing process is performed, oxygen is ionized so that a large amount of charges are generated. In a case where the large amount of charges encounter with the electrode layer (ITO), it is prone to cause an accumulation of charges, resulting in arc discharging over an entire surface of a formed film layer, which in turn affects properties of formed film layers and product characteristics, and may also cause damage to the equipment in severe cases.

As shown in FIGS. 1A-1F, an embodiment of the present disclosure provides a method of manufacturing an array substrate, which includes the following steps 101 through 106.

Figure 1A:
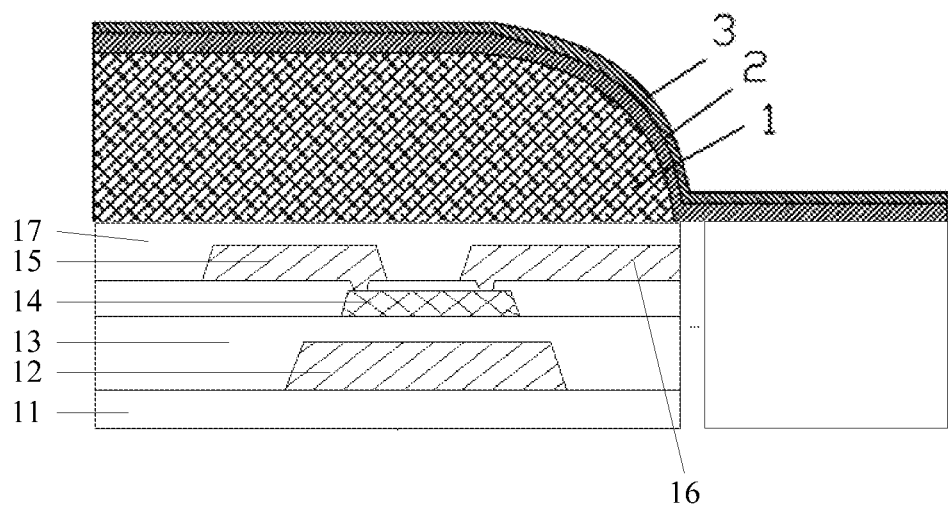
FIG. 1A is a procedure diagram of a first step of a method of manufacturing an array substrate in an embodiment of the present disclosure.

At step 101, a planarization layer 1 is formed above a base substrate, and an electrode layer 2 and a metal functional layer 3 are sequentially formed above the planarization layer 1, as shown in FIG. 1A.

The electrode layer may be a pixel electrode or a common electrode as required. The electrode layer 2 is usually made of ITO material.

The metal functional layer (commonly referred to as Metal 3 or a third metal layer) is usually adopted in a circuit design to achieve a certain storage capacitance. The metal functional layer may be made of metal materials such as Mo.

Figure 1B:
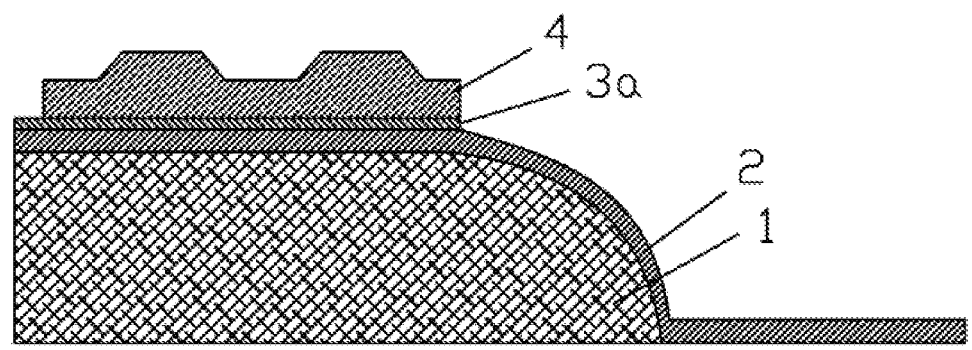
FIG. 1B is a procedure diagram of a second step of the method of manufacturing an array substrate in the embodiment of the present disclosure.

At step 102, the metal functional layer 3 is patterned by using a multi-greyscale mask layer 4 as a mask to form a metal functional layer 3a having a desired pattern of the electrode layer, as shown in FIG. 1B. Here, the desired pattern of the electrode layer refers to a pattern of the finally formed electrode layer (for example, the electrode layer 2a in FIG. 1E described later), in other words, the patterned metal functional layer is used as a mask in subsequent steps so as to pattern the electrode layer.

The multi-greyscale mask layer 4 generally includes a photoresist-completely-reserved area, a photoresist-partially-reserved area and a photoresist-removed area. The multi-greyscale mask layer 4 is usually made of a photoresist material.

In the step 102, by etching a portion of the metal functional layer 3 that is not covered by the multi-greyscale mask layer 4, i.e., the portion corresponding to the photoresist-removed area of the multi-greyscale mask layer 4, the metal functional layer 3 is patterned, so that the metal functional layer 3 is patterned into a desired pattern of the electrode layer.

Figure 1C:
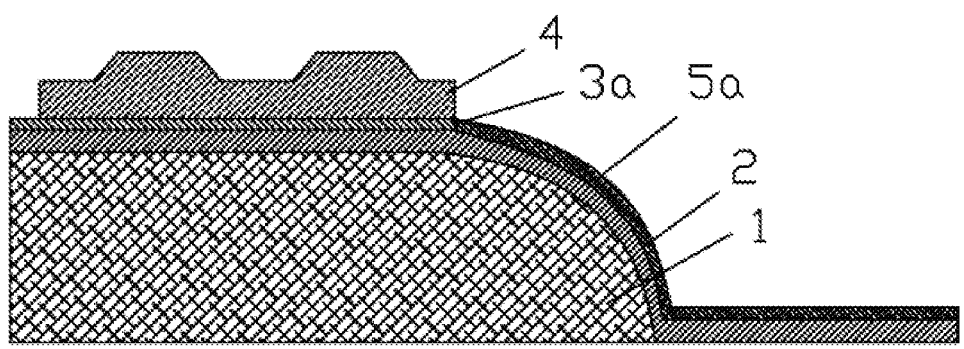
FIG. 1C is a procedure diagram of a third step of the method of manufacturing an array substrate in the embodiment of the present disclosure.

At step 103, an insulating protection layer 5a is formed on a portion of the electrode layer 2 not being covered by the patterned metal functional layer 3a, that is, the insulating protection layer 5a covers all the exposed regions of the electrode layer 2 that are not covered by the metal functional layer 3a, as shown in FIG. 1C.

Figure 1D:
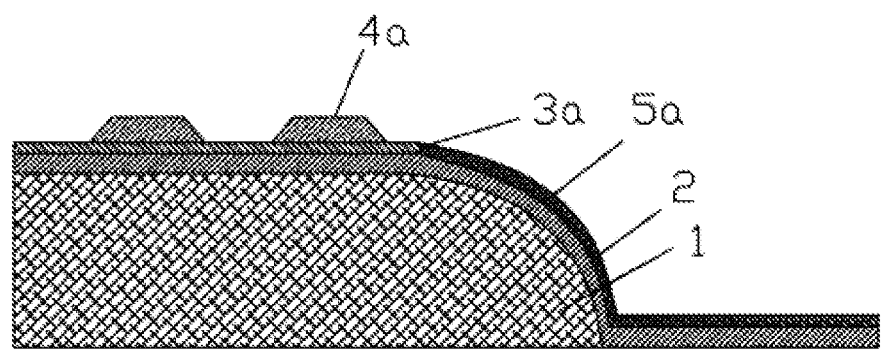
FIG. 1D is a procedure diagram of a fourth step of the method of manufacturing an array substrate in the embodiment of the present disclosure.

At step 104, an ashing process is performed on the multi-greyscale mask layer 4, as shown in FIG. 1D.

The ashing process is performed to remove the photoresist in the photoresist-partially-reserved area of the multi-greyscale mask layer 4 and thin the thickness of the photoresist in the photoresist-completely-reserved area, so as to obtain a multi-greyscale mask layer 4a having the desired pattern of the metal functional layer. Here, the desired pattern of the metal functional layer refers to a pattern of the finally formed metal functional layer (for example, the metal functional layer 3b in FIG. 1F described later) formed by patterning the metal functional layer using the multi-greyscale mask layer 4 as a mask.

Figure 1E:
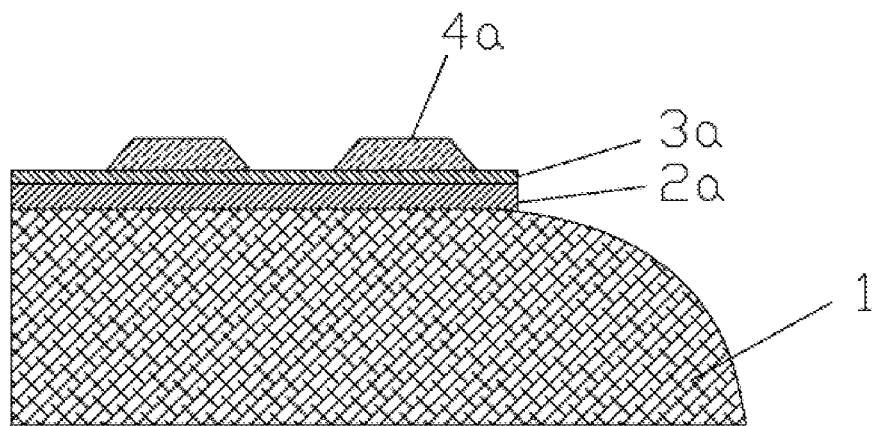
FIG. 1E is a procedure diagram of a fifth step of the method of manufacturing an array substrate in the embodiment of the present disclosure.

At step 105, the electrode layer 2 is patterned by using the patterned metal functional layer 3a as a mask to form an electrode layer 2a having a desired pattern of the electrode layer, as shown in FIG. 1E.

In the step 105, the insulating protection layer 5a and a portion of the electrode layer 2 that is not covered by the metal functional layer 3a may be etched simultaneously or successively.

Figure 1F:
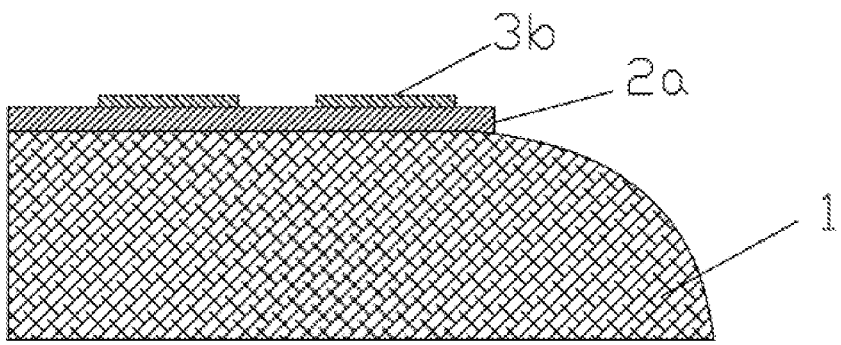
FIG. 1F is a procedure diagram of a sixth step of the method of manufacturing an array substrate in the embodiment of the present disclosure.

At step 106, the metal functional layer 3a is patterned by using the multi-greyscale mask layer 4a subjected to the ashing process as a mask, so that the patterned metal functional layer 3a is further patterned into a metal functional layer 3b having a desired pattern of the metal functional layer, as shown in FIG. 1F.

In the step 106, by etching the portion of the metal functional layer 3a not being covered by the multi-greyscale mask layer 4a, the metal functional layer 3b having the desired pattern of the metal functional layer is obtained.

In summary, the insulating protection layer 5a is formed on the portion of the electrode layer 2 not being covered by the metal functional layer 3a having the desired pattern of the electrode layer (step 103) before the ashing process is performed on the multi-greyscale mask layer 4 (step 104), thus the insulating protection layer 5a can effectively avoid arc discharging when the ashing process is performed, so that properties and product characteristics of formed film layers can be ensured, and processes can be performed smoothly and safely.

It should be noted that, in practical applications, the method further includes: before forming the electrode layer 2 and the metal functional layer 3 successively above the planarization layer 1, providing a base substrate 11; and successively forming a gate 12, a gate insulating layer 13, an active layer 14, a source 15 and a drain 16, a passivation layer 17, and the planarization layer 1 on the base substrate 11.

The base substrate 11, the gate 12, the gate insulating layer 13, the active layer 14, the source 15 and the drain 16, and the passivation layer 17 are conventional configurations of the array substrate, for the sake of simplicity, they are only shown in FIG. 1A, and are not shown in other drawings and will not be described in detail here. Certainly, in practical applications, any further functional film layer can be added or removed as required.

As shown in FIGS. 2A-2G, a method of manufacturing an array substrate in another embodiment of the present disclosure includes a specific implementation for forming the insulating protection layer 5a on the basis of the foregoing embodiment.

Specifically, the formation of the insulating protection layer 5a includes the following steps 201 through 207.

Figure 2A:
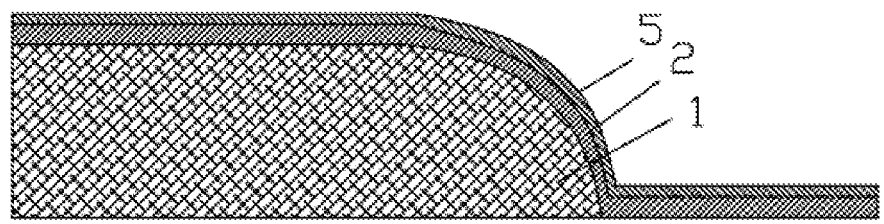
FIG. 2A is a procedure diagram of a first step of a method of manufacturing an array substrate in another embodiment of the present disclosure.

At step 201, an electrode layer 2 and a metal layer 5 are successively formed above the planarization layer 1, as shown in FIG. 2A.

The metal layer includes aluminum. Moreover, the metal layer has a thickness ranging from 100 Å to 200 Å. In addition, the metal layer 5 may be deposited by using a magnetron sputtering method.

Figure 2B:
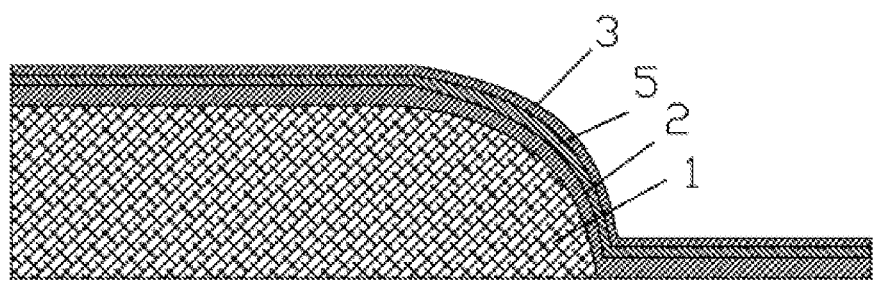
FIG. 2B is a procedure diagram of a second step of the method of manufacturing an array substrate in the embodiment of the present disclosure.

At step 202, a metal functional layer 3 is formed on the metal layer 5, as shown in FIG. 2B.

Figure 2C:
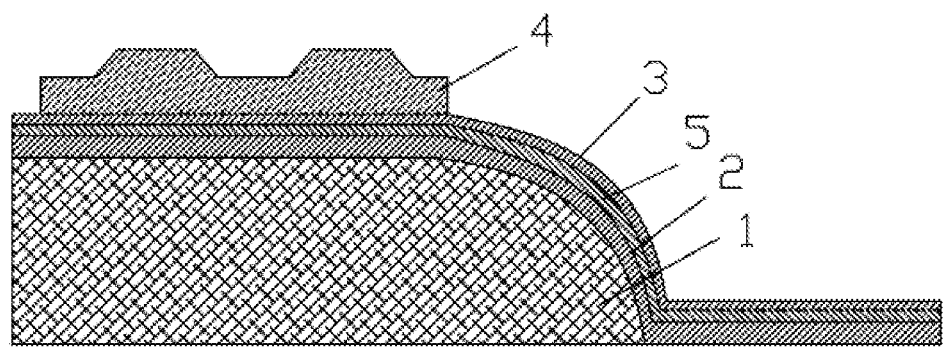
FIG. 2C is a procedure diagram of a third step of the method of manufacturing an array substrate in the embodiment of the present disclosure.
Figure 2D:
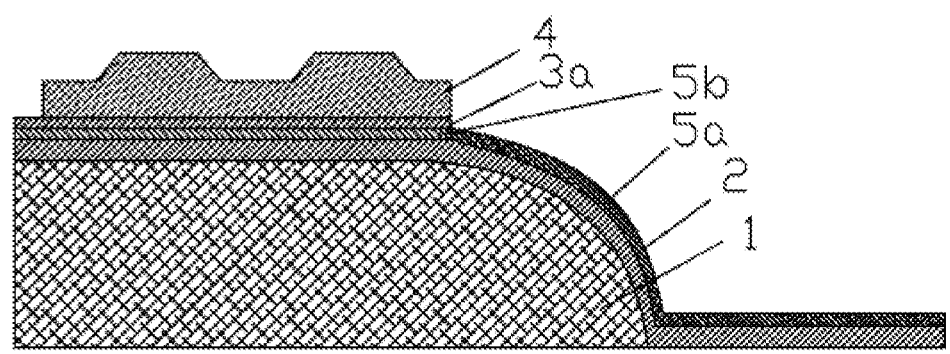
FIG. 2D is a procedure diagram of a fourth step of the method of manufacturing an array substrate in the embodiment of the present disclosure.

At step 203, the metal functional layer 3 is patterned by using the multi-greyscale mask layer 4 as a mask to form a metal functional layer 3a having a desired pattern of the electrode layer, as shown in FIG. 2D.

The step 203 may specifically include steps 2031 through 2033.

At step 2031, a photoresist layer is applied on the metal functional layer 3.

At step 2032, the photoresist layer is exposed by using a multi-greyscale mask plate to form a multi-greyscale mask layer 4 having a desired pattern of the electrode layer on the metal functional layer 3, as shown in FIG. 2C.

At step 2033: a portion of the metal functional layer 3 not being covered by the multi-greyscale mask layer 4 is removed to obtain a metal functional layer 3a having the desired pattern of the electrode layer, as shown in FIG. 2D.

At step 204, an oxidation process is performed on a portion of the metal layer 5 not being covered by the patterned metal functional layer 3a to obtain a transparent and insulating metal oxide layer serving as the insulating protection layer 5a, as shown in FIG. 2D. Meanwhile, a portion 5b of the metal layer 5 covered by the patterned metal functional layer 3a is still a metal material.

For example, for a metal layer of aluminum, a transparent and insulating aluminum oxide layer can be obtained by performing the oxidation process.

In an embodiment, an ion implantation apparatus is used to perform the oxidation process on the portion of the metal layer 5 not being covered by the patterned metal functional layer 3a. The ion implantation apparatus is capable of generating oxygen ions, the oxygen ions are doped into the metal layer from above by an acceleration action of an electrode plate disposed above the metal layer.

Figure 2E:
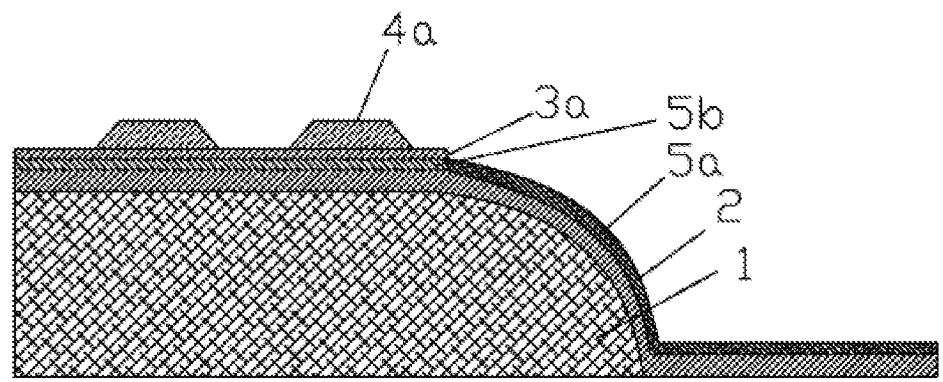
FIG. 2E is a procedure diagram of a fifth step of the method of manufacturing an array substrate in the embodiment of the present disclosure.

At step 205, an ashing process is performed on the multi-greyscale mask layer 4, as shown in FIG. 2E.

The ashing process is performed to remove the photoresist in the photoresist-partially-reserved area of the multi-greyscale mask layer 4 and thin the thickness of the photoresist in the photoresist-completely-reserved area, so as to obtain a multi-greyscale mask layer 4a having the desired pattern of the metal functional layer.

Figure 2F:
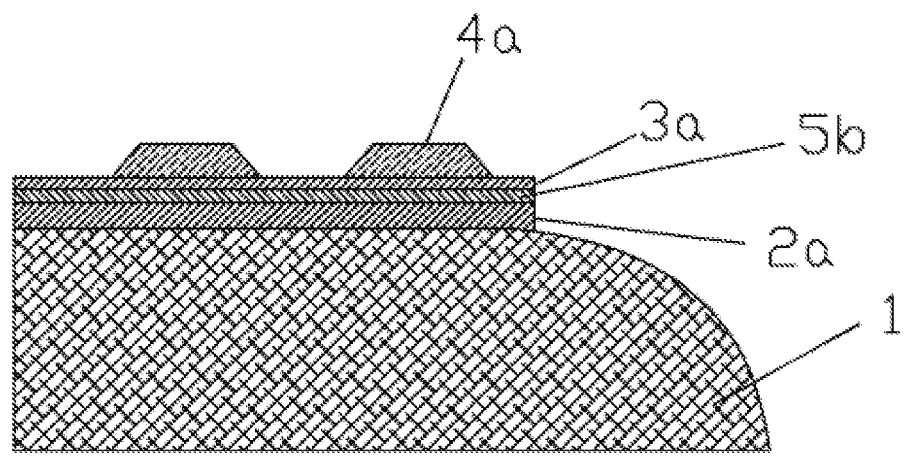
FIG. 2F is a procedure diagram of a sixth step of the method of manufacturing an array substrate in the embodiment of the present disclosure.

At step 206, the insulating protection layer 5a is removed by using the patterned metal functional layer 3a, and only the portion 5b of the metal layer 5 covered by the patterned metal functional layer 3a remains; meanwhile, a portion of the electrode layer 2 not being covered by the metal functional layer 3a is removed, thereby an electrode layer 2a having a desired pattern of electrode layer is formed, as shown in FIG. 2F.

Since the thickness of the insulating protection layer 5a is relatively small (ranging from 100 Å to 200 Å), etching of the insulating protection layer 5a and the portion of the electrode layer 2 not being covered by the metal functional layer has small influence on the morphology of the electrode layer formed of ITO material. In particular, in the case where the insulating protection layer 5a is formed of $Al_2O_3$ material, etching has smaller influence on the morphology of the electrode layer formed of ITO material.

Figure 2G:
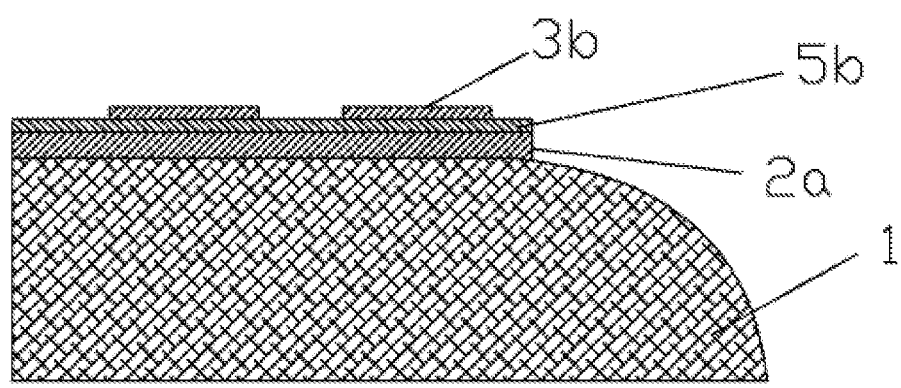
FIG. 2G is a procedure diagram of a seventh step of the method of manufacturing an array substrate in the embodiment of the present disclosure.

At step 207, the patterned metal functional layer 3a is further patterned by using the multi-greyscale mask layer 4a subjected to the ashing process as a mask, so as to form a metal functional layer 3b having a desired pattern of the metal functional layer, as shown in FIG. 2G.

In the method of manufacturing an array substrate in accordance with the present disclosure, before the ashing process is performed on the multi-greyscale mask layer, the insulating protection layer is formed on a portion of the electrode layer that is not covered by a metal functional layer having the desired pattern of the electrode layer. The insulating protection layer can effectively avoid arc discharging when the ashing process is performed, so that properties of formed film layers and product characteristics can be ensured, and the processes can be performed smoothly and safely.

As another technical solution, the present disclosure further provides a method of manufacturing a display device, which includes the method of manufacturing the array substrate in the embodiments of the present disclosure.

The method of manufacturing a display device provided by the present disclosure adopts the method of manufacturing the array substrate in the embodiments of the present disclosure, properties of formed film layers and product characteristics can be ensured, and the processes can be performed smoothly and safely.

It can be understood that the embodiments mentioned above are merely exemplary embodiments used for illustrating the principle of the present disclosure, but the present disclosure is not limited thereto. For those skilled in the art, various modifications and improvements may be made without departing from the spirit and essence of the present disclosure, and these variations and improvements are also considered within the protection scope of the present disclosure.

The invention claimed is:

1. A method of manufacturing an array substrate, comprising steps of:
   forming a planarization layer above a base substrate;
   forming an electrode layer above the planarization layer;
   forming a metal functional layer above the electrode layer;
   patterning the metal functional layer by using a multi-greyscale mask layer as a mask;
   forming an insulating protection layer on a portion of the electrode layer not being covered by the patterned metal functional layer;

performing an ashing process on the multi-greyscale mask layer;

patterning the electrode layer by using the metal functional layer as a mask; and further patterning the metal functional layer by using the multi-greyscale mask layer subjected to the ashing process as a mask, wherein the step of forming the insulating protection layer further comprises:

forming a metal layer on the electrode layer; and performing an oxidation process on the metal layer to obtain a transparent and insulating metal oxide layer serving as the insulating protection layer.

2. The method of manufacturing an array substrate according to claim 1, wherein the step of forming the metal layer on the electrode layer further comprises:

depositing the metal layer on the electrode layer by using a magnetron sputtering method.

3. The method of manufacturing an array substrate according to claim 2, wherein the metal layer has a thickness ranging from 100 Å to 200 Å.

4. The method of manufacturing an array substrate according to claim 3, wherein the metal layer includes aluminum, and the insulating protection layer includes aluminum oxide.

5. The method of manufacturing an array substrate according to claim 1, wherein the oxidation process is performed on the metal layer by using an ion implantation apparatus.

6. The method for manufacturing an array substrate according to claim 1, further comprising:

before patterning the electrode layer by using the metal functional layer as a mask, removing the insulating protection layer.

7. The method of manufacturing an array substrate according to claim 1, wherein the step of patterning the metal functional layer by using the multi-greyscale mask layer as the mask further comprises:

applying a photoresist layer on the metal functional layer;

exposing the photoresist layer by using a multi-greyscale mask plate to form the multi-greyscale mask layer on the metal functional layer; and removing a portion of the metal functional layer not being covered by the multi-greyscale mask layer.

8. The method of manufacturing an array substrate according to claim 1, wherein the metal functional layer includes Mo, and the electrode layer includes ITO.

9. The method of manufacturing an array substrate according to claim 1, further comprising:

before forming the planarization layer above the base substrate, providing the base substrate;

forming a gate, a gate insulating layer, an active layer, a source and a drain, and a passivation layer successively on the base substrate.

10. A method of manufacturing a display device, comprising the method of manufacturing the array substrate according to claim 1.

11. A method of manufacturing an array substrate, comprising steps of:

forming a planarization layer above a base substrate;

forming an electrode layer above the planarization layer;

forming a metal functional layer above the electrode layer;

patterning the metal functional layer by using a multi-greyscale mask layer as a mask;

forming an insulating protection layer on a portion of the electrode layer not being covered by the patterned metal functional layer;

performing an ashing process on the multi-greyscale mask layer;

patterning the electrode layer by using the metal functional layer as a mask; and further patterning the metal functional layer by using the multi-greyscale mask layer subjected to the ashing process as a mask.

12. The method of manufacturing an array substrate according to claim 11, wherein the step of forming the insulating protection layer further comprises:

performing an oxidation process on a portion of the metal layer not being covered by the patterned metal functional layer to obtain a transparent and insulating metal oxide layer serving as the insulating protection layer.

13. The method of manufacturing an array substrate according to claim 12, wherein the step of forming the metal layer on the electrode layer further comprises:

depositing the metal layer on the electrode layer by using a magnetron sputtering method.

14. The method of manufacturing an array substrate according to claim 13, wherein the metal layer has a thickness ranging from 100 Å to 200 Å.

15. The method of manufacturing an array substrate according to claim 14, wherein the metal layer includes aluminum, and the insulating protection layer includes aluminum oxide.

16. The method of manufacturing an array substrate according to claim 12, wherein the oxidation process is performed on the metal layer by using an ion implantation apparatus.

17. The method for manufacturing an array substrate according to claim 12, further comprising:

before patterning the electrode layer by using the metal functional layer as the mask, removing the insulating protection layer.

18. A method of manufacturing a display device, comprising the method of manufacturing the array substrate according to claim 11.

* * * * *